United States Patent
Liu (10) Patent No.: US 10,048,555 B2
(45) Date of Patent: Aug. 14, 2018

(54) ARRAY SUBSTRATE, MANUFACTURING METHOD THEREOF AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Rongcheng Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/762,588

(22) PCT Filed: Oct. 1, 2014

(86) PCT No.: PCT/CN2014/088085
§ 371 (c)(1),
(2) Date: Jul. 22, 2015

(87) PCT Pub. No.: WO2016/004686
PCT Pub. Date: Jan. 14, 2016

(65) Prior Publication Data
US 2016/0246149 A1    Aug. 25, 2016

(30) Foreign Application Priority Data

Jul. 11, 2014   (CN) .......................... 2014 1 0331427

(51) Int. Cl.
*G02F 1/1343*    (2006.01)
*G02F 1/1345*    (2006.01)
(Continued)

(52) U.S. Cl.
CPC .... *G02F 1/136286* (2013.01); *G02F 1/13439* (2013.01); *G02F 1/133345* (2013.01);
(Continued)

(58) Field of Classification Search
USPC .................. 349/69–71, 149–152, 38, 39, 139
See application file for complete search history.

(56) References Cited

U.S. PATENT DOCUMENTS 6,392,626 B1    5/2002  Moon
6,587,161 B1 *  7/2003  Yamamoto ........ G02F 1/136286
                                                257/72
(Continued)

FOREIGN PATENT DOCUMENTS

CN    1253303 A    5/2000
CN    102650785 A  8/2012
(Continued)

OTHER PUBLICATIONS

First Chinese Office Action dated May 20, 2016; Appln. No. 201410331427.X.
(Continued)

*Primary Examiner* — Edward Glick
*Assistant Examiner* — David Chung
(74) *Attorney, Agent, or Firm* — Ladas & Parry LLP (57) ABSTRACT

An array substrate includes: a first metal area disposed at an edge portion of the array substrate and electrically connected with a common electrode line or common electrodes; a second metal area disposed at the edge portion of the array substrate, corresponding to and insulated from the first metal area, and configured for access of a stabilized voltage that is a fixed voltage. At least one capacitor is formed by the first metal area and the second metal area. The array substrate can obtain more stable pixel common electrode voltage.

20 Claims, 3 Drawing Sheets

(51) Int. Cl.
*G02F 1/1362* (2006.01)
*G02F 1/1333* (2006.01)
*H01L 27/12* (2006.01)

(52) U.S. Cl.
CPC ...... *G02F 1/136227* (2013.01); *H01L 27/124* (2013.01); *H01L 27/1255* (2013.01); *H01L 27/1259* (2013.01); *G02F 2001/136295* (2013.01); *G02F 2201/121* (2013.01)

(56) References Cited

U.S. PATENT DOCUMENTS

| | | | | |
|---|---|---|---|---|
| 7,724,314 | B2* | 5/2010 | Tanaka | G02F 1/1345 349/139 |
| 7,787,066 | B2* | 8/2010 | Jeon | G02F 1/136213 349/38 |
| 2003/0128306 | A1* | 7/2003 | Kai | G02F 1/136213 349/39 |
| 2007/0085960 | A1* | 4/2007 | Kim | G02F 1/1345 349/149 |
| 2007/0222031 | A1* | 9/2007 | Jow | H01G 4/232 257/532 |
| 2010/0060815 | A1* | 3/2010 | Yamada | G02F 1/1345 349/39 |
| 2012/0026446 | A1 | 2/2012 | Xi et al. | |
| 2014/0166555 | A1 | 6/2014 | Um et al. | |
| 2015/0287741 | A1* | 10/2015 | Wang | H01L 23/5226 257/71 |

FOREIGN PATENT DOCUMENTS

| | | |
|---|---|---|
| CN | 103064225 A | 4/2013 |
| CN | 203054411 U | 7/2013 |
| JP | 2003-218222 A | 7/2003 |

OTHER PUBLICATIONS

International Search Report Appln. No. PCT/CN2014/088085; dated Apr. 21, 2015.
Written Opinion of the International Searching Authority Appln. No. PCT/CN2014/088085; dated Apr. 21, 2015.
Second Chinese Office Action dated Oct. 10, 2016; Appln. No. 201410331427.X.
Third Chinese Office Action dated Mar. 24, 2017; Appln. No. 201410331427.X.
Extended European Search Report dated Jan. 24, 2018; Appln. No. 14882153.1.

* cited by examiner

ARRAY SUBSTRATE, MANUFACTURING METHOD THEREOF AND DISPLAY DEVICE

TECHNICAL FIELD

Embodiments of the present invention relate to an array substrate, a manufacturing method thereof and a display device.

BACKGROUND

Liquid crystal displays (LCDs) are currently commonly used flat panel displays, and thin-film transistor liquid crystal displays (TFT-LCDs) belong to the mainstream products among LCDs.

TFT-LCDs hold most of the market share in the small and medium size field due to low cost, high yield and good display effect. Although the TFT-LCD technology has become gradually mature, the image quality still needs to be continuously improved to meet the demands of consumers.

An LCD panel generally comprises an array substrate, a color filter (CF) substrate and liquid crystals disposed between the array substrate and the CF substrate. In an LCD device, a ground capacitor is additionally arranged on a common voltage (Vcom) generating unit on a printed circuit board assembly (PCBA) to stabilize the common voltage supplied to the array substrate; the common voltage stabilized by the ground capacitor is connected with a common electrode line in the LCD panel by means of wirings (including wirings on the PCBA, bonding connection between the PCBA and a chip on film (COF), wirings on the COF, bonding between the COF and the LCD panel, and wirings on the LCD panel). Therefore, a resistor R is provided between the Vcom generating unit on the PCBA and the common electrode line in the LCD panel. In the LCD panel, because data lines, gate lines and common electrode lines have coupling to each other, the common voltage tends to suffer from disturbance due to the coupling, which is also referred to as noise/ripple. If the common voltage subjected to disturbance cannot be quickly restored, the displayed images of the LCD panel will have the problems of flicker, greenish or the like. At this time, the process of alleviating the disturbance and restoring the common voltage to be stable is commonly completed by the Vcom generating unit on the PCBA and the ground capacitor on the circumference thereof. However, due to the resistor R, the ability of the Vcom generating unit and the ground capacitor connected therewith in maintaining the stability of the Vcom is greatly reduced.

SUMMARY

At least one embodiment of the present invention provides an array substrate, which comprises: a first metal area disposed at an edge portion of the array substrate and electrically connected with a common electrode line or common electrodes; and a second metal area disposed at the edge portion of the array substrate, corresponding to and insulated from the first metal area, and configured for access of a stabilized voltage that is a fixed voltage. At least one capacitor is formed by the first metal area and the second metal area.

For instance, the first metal area is formed by a gate metal layer; and the second metal area is formed by a source/drain metal layer.

For instance, the first metal area includes at least two first metal sub-areas which are electrically connected with each other through a first connecting line or directly electrically connected with each other; and the second metal area includes at least two second metal sub-areas which are electrically connected with each other through a second connecting line or directly electrically connected with each other.

For instance, the first connecting line is formed by a common electrode layer or a source/drain metal layer.

For instance, the second connecting line is formed by a pixel electrode layer.

For instance, the stabilized voltage is a ground voltage or a fixed voltage supplied by a power source.

For instance, the first metal area is electrically connected with the common electrode line or the common electrodes via through holes; or the first metal area is directly electrically connected with the common electrode line or electrically connected with the common electrode line through a connecting line.

At least one embodiment of the present invention further provides a display device, which not only comprises the foregoing array substrate but also comprises a Vcom generating unit configured to provide a voltage for common electrodes.

At least one embodiment of the present invention further provides a method for manufacturing an array substrate. The method comprises: forming a first metal layer on a transparent substrate, in which the first metal layer includes a first metal area disposed at an edge portion of the array substrate; forming an insulating layer on the first metal layer; and forming a second metal layer on the insulating layer, in which the second metal layer includes a second metal area corresponding to and insulated from the first metal area; and at least one capacitor is formed by the first metal area and the second metal area.

For instance, the step of forming the first metal layer on the transparent substrate may include: forming a first metal film on the transparent substrate; and forming gate electrodes, gate lines, a common electrode line and the first metal area through the first metal film by a patterning process.

For instance, the step of forming the second metal layer on the insulating layer may include: forming a second metal film on the insulating layer; and forming source electrodes, drain electrodes and the second metal area through the second metal film by a patterning process.

For instance, the step of forming the second metal layer on the insulating layer may include: forming a second metal film on the insulating layer; and forming source electrodes, drain electrodes, a first connecting line and the second metal area through the second metal film by a patterning process, in which the first connecting line is configured to connect the at least two first metal sub-areas, which are not electrically connected with each other, of the first metal area.

For instance, between the step of forming the insulating layer and the step of forming the second metal layer, the method may further comprise forming a first transparent conductive layer on the insulating layer. This step may include: forming through holes in the insulating layer: forming a first transparent conductive film on the insulating layer provided with the through holes; and forming common electrodes and a first connecting line through the first transparent conductive film by a patterning process, in which the first connecting line is configured to connect the at least two first metal sub-areas, which are not electrically connected with each other, of the first metal area via the through holes.

For instance, after the step of forming the second metal layer, the method may further comprise: forming a passivation layer; forming through holes in the passivation layer; and forming a second transparent conductive layer on the passivation layer provided with the through holes. For instance, a second transparent conductive film is formed on the passivation layer provided with the through holes; and pixel electrodes and a second connecting line are formed through the second transparent conductive film by a patterning process, in which the second connecting line is configured to connect the at least two second metal sub-areas, which are not electrically connected with each other, of the second metal area.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The array substrate provided by an embodiment of the present invention is applicable to LCD devices of various display types. An LCD device utilizes electric field to control the light transmittance to display images. According to the direction of the electric field driving liquid crystals, the LCD device is broadly divided into vertical electric field drive type and horizontal electric field drive type. In a vertical electric field drive type LCD device, e.g., a twisted nematic (TN) or vertical alignment (VA) LCD device, common electrodes and pixel electrodes are arranged on an upper substrate and a lower substrate respectively and opposite to each other, and vertical electric fields are formed between the common electrodes and the pixel electrodes to drive liquid crystals. In a horizontal electric field drive type LCD device, e.g., an ADS or in-plane switch (IPS) LCD device, common electrodes and pixel electrodes are arranged on a lower substrate, and horizontal electric fields are formed between the common electrodes and the pixel electrodes to drive liquid crystals.

No matter an LCD device of which type is adopted, the displayed grayscale of pixels of an LCD panel depends on the voltage difference applied between pixel electrodes and common electrodes. In general, the voltage of an electrode on a liquid crystal layer is maintained to be stable, and the electrode is also referred to as a common electrode; and the other electrode on the liquid crystal layer is referred to as a pixel electrode, and the displayed grayscale of a pixel is determined by the change on the voltage of the pixel electrode.

In an embodiment of the present invention, a capacitor is formed in an array substrate; a common voltage (Vcom) is supplied to one electrode of the capacitor (the electrode is connected with a common electrode line or common electrodes); and another voltage is supplied to the other electrode, so that more stable common voltage effect can be achieved.

One embodiment of the present invention provides an array substrate, which comprises: a first metal area disposed at the edge portion of the array substrate and electrically connected with a common electrode line or a common electrode; and a second metal area disposed at the edge portion of the array substrate, corresponding to the first metal area, and configured for the access of a stabilized voltage which is a fixed voltage. At least one capacitor is formed by the first metal area and the second metal area.

In at least one embodiment of the present invention, a capacitor is formed in an LCD panel and can have the function of a ground capacitor disposed on the outside of the LCD panel and connected with a Vcom generating unit, so that the ground capacitor can be reduced or replaced. Although the ground capacitor has insufficient ability in maintaining stable Vcom because a resistor is formed between the Vcom generating voltage on a PCBA and a common electrode line in an LCD panel, in the embodiment of the present invention, a stable capacitor is formed in the LCD panel, so that more stable technical effect on the pixel common electrode voltage can be obtained, and hence the technical problems such as flicker and greenish of display images of the LCD panel caused by the pixel electrode voltage with large noise can be solved.

In the embodiment of the present invention, both the gate metal layer and the source/drain metal layer are independent layers. In the disclosure, "layer" means one layer of film prepared on a substrate through a specific material by a process such as deposition. For instance, an insulating layer mentioned in the latter text may be prepared by the deposition of silicon nitride (SiNx) on a transparent substrate. In addition, "layer" may also mean a layer structure including a plurality of patterns formed by a patterning process after one layer of film is prepared on a substrate through a specific material by a process such as deposition. For instance, the gate metal layer may be a layer structure including a gate line, a gate electrode and a first metal area formed by one patterning process after a metal film is prepared by the deposition of molybdenum on a transparent substrate. Moreover, for instance, the source/drain layer may also be a layer structure including a data line, a source electrode and a drain electrode formed by one patterning process after a metal film is prepared by the deposition of molybdenum on a transparent substrate. Furthermore, for instance, the insulating layer mentioned in the latter text may be as follows: according to actual demands, an insulating film is prepared by the deposition of SiNx on a transparent substrate at first, and hence partial insulating film is removed by a patterning process to form through holes at specific positions to form the insulating layer. That is to say, in the embodiment of the present invention, different layers are formed by different films (same or different materials).

In the array substrate provided by at least one embodiment of the present invention, a voltage stabilization circuit can be formed by the arrangement of the first metal area and the second metal area.

Figure 1:
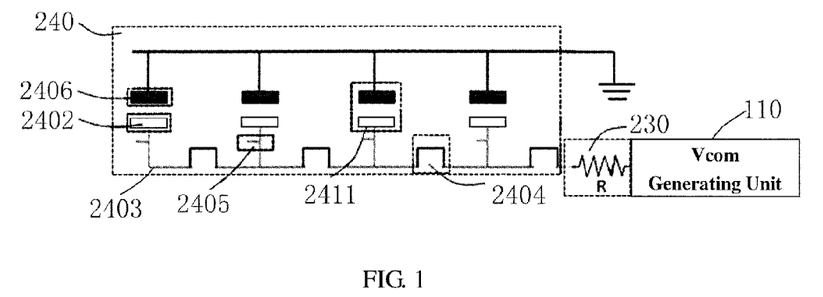
FIG. 1 illustrates a voltage stabilization circuit provided by an embodiment of the present invention.

As illustrated in FIG. 1, the embodiment 1 of the present invention provides a voltage stabilization circuit structure. At least one capacitor 2411 is formed by a first metal area and a corresponding second metal area disposed on the periphery of an array substrate 240. For instance, a plurality of capacitors 2411 are connected in parallel with each other. For instance, capacitors 2411 are formed on four sides of the periphery of the array substrate respectively. One electrode 2402 (namely at least one first metal sub-area) of a capacitor 2411 is formed by the gate metal layer, and the other electrode 2406 of the capacitor is formed by the source/drain metal layer. For instance, the electrodes 2402 are connected with each other through a connecting line 2403. If the connecting line 2403 and the first metal areas are formed by the patterning of the gate metal layer, in order to step over gate lines, the connecting line 2403 may be discontinuous. The discontinuous connecting line 2403 must be further connected through a first connecting line 2404 (may be formed by the source/drain metal layer). Or if the connecting line 2403 is formed by the patterning of a common electrode indium tin oxide (ITO) layer, the connecting line 2403 is continuous and configured to electrically connect a plurality of electrodes 2402. The connecting line 2403 may also be formed by the source/drain metal layer. In this case, if the connecting line 2403 is discontinuous, the connecting line 2403 may be connected through a second connecting line formed by a pixel electrode ITO layer. The electrodes 2406 are formed by the source/drain metal layer, and the electrodes 2406 may be directly electrically conducted with each other. If the electrodes 2406 are not mutually conducted, the electrodes 2406 may be connected through the second connecting line formed by the pixel electrode ITO layer. The electrodes 2406 (namely the second metal area) are provided with a stabilized voltage which is a ground voltage or a fixed voltage supplied by a power source. On one hand, the electrodes 2402 are electrically connected with a common electrode line 2405 and common electrodes in a pixel array through the connecting line 2403. On the other hand, the electrodes 2402 are connected with a Vcom generating unit 110 on the outside of the panel through the connecting line 2403 and an external connection line of the array substrate and are provided with the common voltage Vcom.

In the LCD panel, as the data lines, the gate lines and the common electrode line having coupling therebetween, and the common voltage Vcom suffers from disturbance due to the coupling, the common voltage Vcom subjected to disturbance can be quickly restored by the capacitor 2411 formed in the array substrate. Although a wire resistor R is formed between the common electrode line of the array substrate and the Vcom generating unit on the PCBA, because the capacitor 2411 is formed in the array substrate, the wire resistor R will not reduce the voltage stabilization ability of the capacitor 2411.

As the common electrode line is to input a common voltage Vcom into common electrodes, the common electrode line must be electrically connected with the common electrodes. The common electrodes are generally arranged on the same layer as gate lines but are not electrically connected with the gate lines. For instance, in order to ensure that the common electrode line does not make contact with the gate lines, a horizontal first common electrode line is parallel to the gate lines and a vertical second common electrode line is discontinuous because it is unable to make contact with the gate lines. For the conduction of the vertical second common electrode line, the discontinuous electrode line must be connected via through holes and a connecting line. As the first metal area is arranged on the same layer as the gate lines, the first metal area is an area on the periphery of the array substrate, may be an area on at least one side of the array substrate, for instance, is set to be in bar areas on four sides of the array substrate respectively. Horizontal first metal areas (preferably bar areas) are continuous, and vertical first metal areas (preferably bar areas) are discontinuous. For the conduction of the first metal area, the first metal area may be connected with the discontinuous common electrode line, and the discontinuous common electrode line is further connected through the connecting line, and hence the mutual conduction over the entire first metal area can be achieved. In order to further reduce the number of steps in the manufacturing process, the connecting line may be arranged on the same layer as the common electrodes and may also be arranged on the same layer as the source/drain metal layer. If the connecting line is arranged on the same layer as the common electrodes, the connecting line is made of a same material as pixel electrodes, e.g., ITO, and the overall resistance of the common electrode line and the connecting line is large to some extent. If the connecting line is arranged on the same layer as the source/drain metal layer, as the connecting line is made of a same material as the source/drain metal layer and the material is a good conductive material, the overall resistance of the common electrode line and the connecting line can be reduced, which is more favorable to the stability of the common voltage Vcom. Moreover, the display quality can be further improved.

The first metal area may be electrically connected with the common electrode line or the common electrodes via through holes and may also be directly electrically connected with the common electrode line or electrically connected with the common electrode line through a connecting line, which way is determined by the specific technological process. In summary, the common voltage Vcom is provided to the first metal area, so that the stability of the common voltage Vcom can be achieved.

The second metal area is an area on the periphery of the array substrate, corresponds to the first metal area, and may include a plurality of metal sub-areas. The arrangement of the metal sub-areas may be determined by the demand of a capacitor for stabilizing the common voltage Vcom, the technological difficulty and the compatibility of the conventional process. The second metal area may be an area on at least one side of the array substrate, for instance, is set to be bar areas on four sides of the array substrate respectively.

For instance, the second metal area is formed by the patterning of the source/drain metal layer. The patterning of the source/drain metal layer is slightly adjusted to be maximally compatible with the conventional process. In the patterning process, a pattern of the second metal area is not electrically connected with data line patterns in pixel units. As the second metal area (preferably bar area) may be discontinuous as required to step over data lines, the discontinuous second metal area may be conducted through a connecting line formed by a pixel electrode layer (e.g., an ITO layer). The second metal area is provided with a stabilized voltage being a ground voltage or a fixed voltage supplied by a power source.

In an embodiment of the present invention, a capacitor is formed in the array substrate to stabilize the common voltage Vcom of the common electrodes on the array substrate, so that the embodiment of the present invention may be applied in array substrates of two display types, namely IPS and ADS. Description will be given below through the second embodiment by taking an ADS display type array substrate as an example.

Figure 2A:
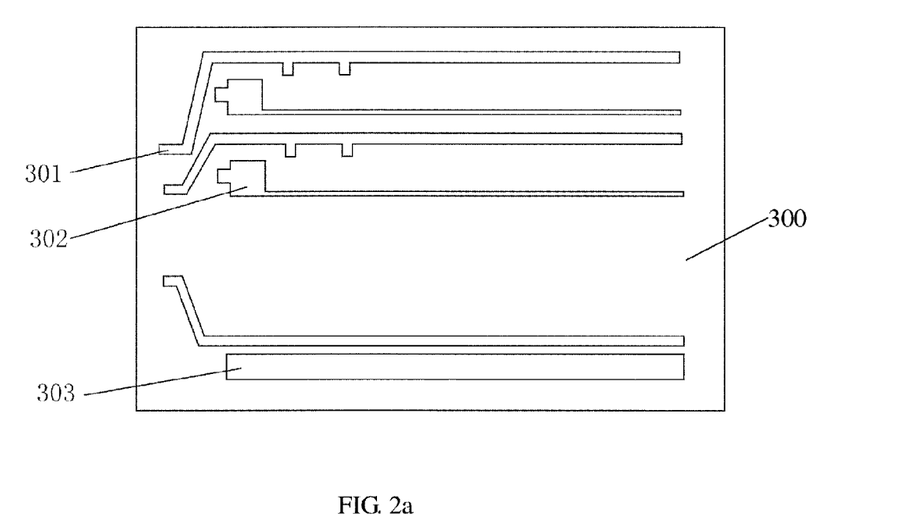
FIGS. 2a to 2e are respectively a schematic structural view of an array substrate applied in an advanced super dimension switching (ADS) type display device, provided by an embodiment of the present invention.
Figure 2B:
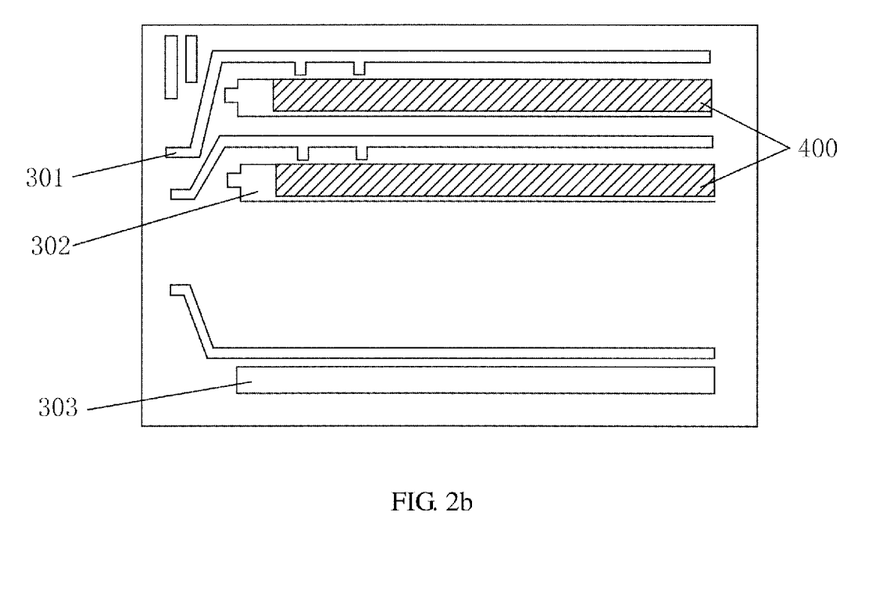
Figure 2C:
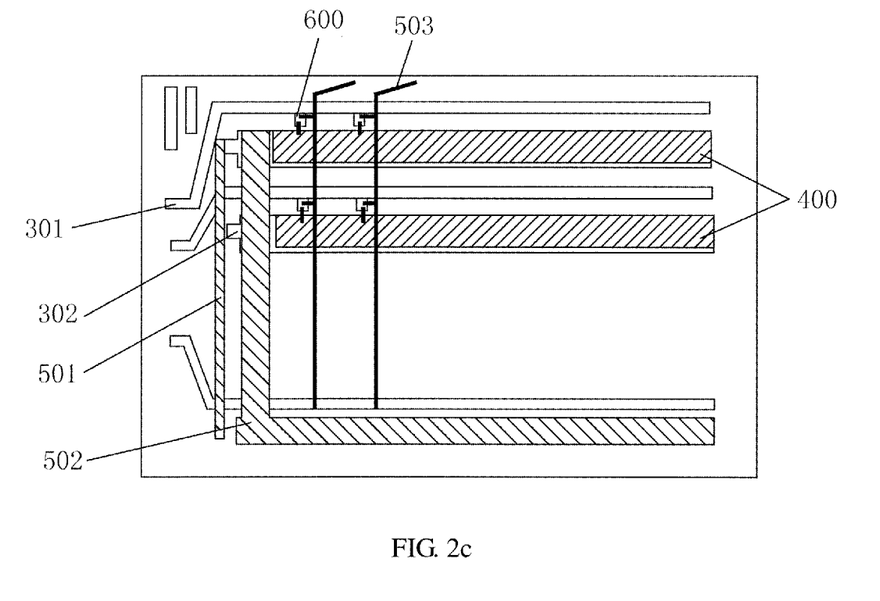
Figure 2D:
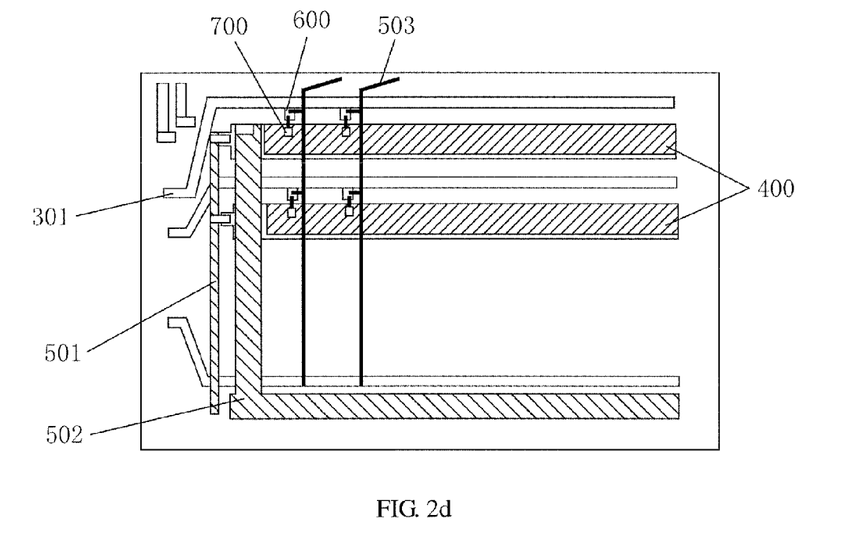
Figure 2E:
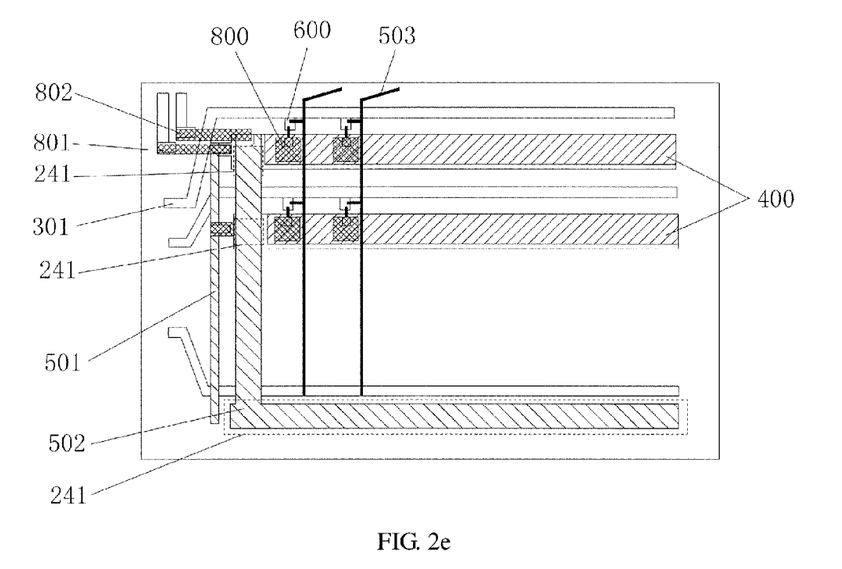

As illustrated in FIGS. 2a to 2e, the array substrate provided by an embodiment comprises: a transparent substrate 300 and a gate metal layer and a source/drain metal layer disposed on the transparent substrate 300. As illustrated in FIG. 2a, the gate metal layer includes gate electrodes, gate lines 301, common electrode lines 302 and a first metal area 303 disposed on the periphery of the array substrate. As illustrated in FIG. 2c, the source/drain metal layer includes: data lines 503, drain electrodes 600, drain electrodes (not shown in the figure), a connecting line 501 and a second metal area 502 disposed at the edge portion of the array substrate. In addition, the array substrate further comprises two transparent conductive layers. As illustrated in FIG. 2b, the first transparent conductive layer includes common electrodes 400 and is formed above the gate metal layer (a planarization layer is formed between the gate metal layer and the first transparent conductive layer). As illustrated in FIG. 2e, the second transparent conductive layer includes pixel electrodes 800. A gate insulating layer is formed between the first transparent conductive layer and the source/drain metal layer, and a passivation layer is formed between the source/drain metal layer and the second transparent conductive layer. As illustrated in FIG. 2d, second through holes 700 are formed in the passivation layer, and at least two first metal sub-areas of the first metal area 303 are electrically connected with each other through a first connecting line 501; third through holes (not indicated in the figure) are formed in the passivation layer, and at least two second metal sub-areas of the second metal area 502 are electrically connected with each other through a second connecting line (not shown in the figure); fourth through holes are formed in the passivation layer, and the first metal area 303 is electrically connected with an external connection line on the array substrate through a third connecting line 801 formed by the second transparent conductive layer; fifth through holes are formed in the passivation layer, and the second metal area 502 is electrically connected with an external connection line on the array substrate through a fourth connecting line 802 formed by the second transparent conductive layer; and fifth through holes are formed in the passivation layer, and pixel electrodes 700 formed by the second transparent conductive layer are electrically connected with drain electrodes formed by the source/drain metal layer. As the first metal area is connected with the common voltage Vcom and the second metal area is connected with a stabilized voltage that is a fixed voltage, as illustrated in FIG. 2e, a capacitor structure 241 is formed by the first metal area 303 and the second metal area in the array substrate.

The third embodiment of the present invention provides a method for manufacturing an array substrate. The method comprises: forming a first metal layer on a transparent substrate, in which the first metal layer includes a first metal area disposed at an edge portion of the array substrate; forming an insulating layer on the first metal layer; and forming a second metal layer on the insulating layer, in which the second metal layer includes a second metal area corresponding to and insulated from the first metal area.

For instance, the step of forming the first metal layer on the transparent substrate may include: forming a first metal film on the transparent substrate; and forming gate electrodes, gate lines, a common electrode line and the first metal area with the first metal film by a patterning process.

For instance, the step of forming the second metal layer on the insulating layer may include: forming a second metal film on the insulating layer; and forming source electrodes, drain electrodes and the second metal area with the second metal film by a patterning process.

For instance, the step of forming the second metal layer on the insulating layer may include: forming a second metal film on the insulating layer; and forming source electrodes, drain electrodes, a first connecting line and the second metal area with the second metal film by a patterning process, in which the first connecting line is configured to connect the at least two first metal sub-areas, which are not electrically connected with each other, of the first metal area.

For instance, the method further comprises the step of forming a first transparent conductive layer on the insulating layer between the step of forming the insulating layer and the step of forming the second metal layer. The step includes: forming through holes in the insulating layer; forming a first transparent conductive film (e.g., an ITO film) on the insulating layer provided with the through holes; and forming common electrodes and a first connecting line with the first transparent conductive film by a patterning process, in which the first connecting line is configured to connect the at least two first metal sub-areas, which are not electrically connected with each other, of the first metal area via the through holes.

For instance, after the step of forming the second metal layer, the method may further comprise: forming a passivation layer; and forming through holes in the passivation layer. The step of forming the second transparent conductive layer on the passivation layer provided with the through holes may include: forming a second transparent conductive film (e.g., an ITO film) on the passivation layer provided with the through holes; and forming pixel electrodes and a second connecting line through the second transparent conductive film by a patterning process, in which the second connecting line is configured to connect the at least two second metal sub-areas, which are not electrically connected with each other, of the second metal area.

Other structures of the array substrate will not be described in detail in the embodiment.

Subsequently, the fourth embodiment of the present invention provides a method for manufacturing an array substrate of an ADS type display device. The method is described below.

S1: forming a gate metal layer on a transparent substrate, in which the gate metal layer includes gate electrodes, gate lines, a common electrode line and a first metal area disposed on the periphery of the substrate. For instance, a gate metal film is formed on a transparent substrate; and patterns of gate electrodes, gate lines, a common electrode line and a first metal area are formed in the gate metal film by one patterning process. For instance, the gate electrodes, the gate lines, the common electrode line and the first metal area may be made of metal such as molybdenum (Mo), aluminum (Al) and cadmium (Cr).

S2: forming a planarization layer on the gate metal layer. For instance, first through holes are formed in the planarization layer; and subsequently formed common electrodes are electrically connected with the common electrode line on the gate metal layer via the first through holes.

S3: forming a first transparent conductive layer on the planarization layer to form the common electrodes. For instance, the first transparent conductive layer is preferably made of ITO; and the common electrodes may be slit-shaped or include slits therein.

S4: forming a gate insulating layer. For instance, the gate insulating layer may be made of silicon oxide or silicon nitride.

S5: forming a source/drain metal layer on the gate insulating layer to form data lines, source electrodes, drain electrodes, a first connecting line and a second metal area, in which the second metal area corresponds to the first metal area.

S6: forming a passivation layer on the source/drain metal layer, and forming through holes in the passivation layer. For instance, a plurality of through holes are formed, and various electrical connections are achieved via the through holes. For instance, second through holes are formed, and the plurality of first metal sub-areas of the first metal area are connected with each other through the first connecting line; third through holes are formed, and at least two second metal sub-areas, which are not electrically connected with each other, of the second metal area are connected with each other through a subsequently formed second connecting line; fourth through holes are formed, and the first metal area is connected with an external connection line on the array substrate through a subsequently formed third connecting line; and fifth through holes are formed, and the second metal area is connected with an external connection line on the array substrate through a subsequently formed fourth connecting line.

S7: forming a second transparent conductive film on the passivation layer provided with the through holes, and forming pixel electrodes and the second connecting line by a patterning processes such as masking and etching, in which the second transparent conductive film is preferably made of an ITO material.

In the method provided by the embodiment, the patterning process of the gate metal layer and the source/drain metal layer may be modified by the traditional wiring mode and process of the array substrate; the stabilized voltage is formed in the LCD panel to maximally stabilize the common voltage Vcom via the manufacturing process of film layers in the LCD panel; and meanwhile, the manufacturing process of the LCD panel cannot be additionally increased and the cost can be reduced.

An embodiment of the present invention further provides a display device, which not only comprises the array substrate provided by the embodiment of the present invention but also comprises a Vcom generating unit configured to provide a voltage for common electrodes. The array substrate may be obtained by the manufacturing method provided by an embodiment of the present invention.

The display device may be any product or component with display function such as an LCD panel, an LCD, a digital camera, a mobile phone and a tablet PC.

For instance, the Vcom generating unit is disposed on the outside of the panel. For instance, the Vcom generating unit is disposed on a PCBA.

The foregoing is only the preferred embodiments of the present invention and not intended to limit the scope of protection of the present invention. The scope of protection of the present invention should be defined by the appended claims.

The application claims priority to the Chinese patent application No. 201410331427.X, filed Jul. 11, 2014, the disclosure of which is entirely incorporated herein by reference as part of the application.

The invention claimed is:

1. An array substrate, comprising a first metal layer, an insulation layer and a second metal layer sequentially provided on a transparent substrate, and a first connecting line provided on the insulation layer,
wherein the first metal layer comprises a first metal area disposed at an edge portion of the array substrate and including at least two first metal sub-areas, the at least two first metal sub-areas are electrically connected by the first connecting line via through holes in the insulation layer,
the second metal layer comprises a second metal area disposed at the edge portion of the array substrate, corresponding to and insulated from the first metal area, and configured for access of a stabilized voltage that is a fixed voltage, wherein the second metal area includes at least two second metal sub-areas, which are electrically connected with each other through a second connecting line, and
at least two capacitors are formed by the at least two first metal sub-areas of the first metal area and the second metal area, the at least two first metal sub-areas are provided in a same layer, and the first metal area and the second metal area are overlapped with each other in a direction perpendicular to a surface of the array substrate so as to form the at least two capacitors.

2. The array substrate according to claim 1, wherein the first metal area is formed by a gate metal layer; and the second metal area is formed by a source/drain metal layer.

3. The array substrate according to claim 1, wherein the second metal area disposed at the edge portion of the array substrate and the second connecting line are disposed at different layers.

4. The array substrate according to claim 1, further comprising a first transparent conductive layer provided on the insulation layer, wherein
the first transparent conductive layer comprises the first connecting line and common electrodes.

5. The array substrate according to claim 3, wherein the second connecting line is formed by a pixel electrode layer.

6. The array substrate according to claim 1, wherein the stabilized voltage is a ground voltage or a fixed voltage supplied by a power source.

7. A display device, comprising:
the array substrate according to claim 1; and
a Vcom generating unit configured to provide a voltage for common electrodes.

8. The array substrate according to claim 2, wherein the second metal area includes at least two second metal sub-areas which are electrically connected with each other through a second connecting line or directly electrically connected with each other.

9. The array substrate according to claim 1,
the first connecting line and the first metal area are disposed at different layers.

10. The array substrate according to claim 1, wherein two of the at least two first metal sub-areas are disposed at a first edge and a second edge of the array substrate respectively, and the first edge and the second edge are adjacent to each other.

11. The array substrate according to claim 1, wherein two of the at least two second metal sub-areas are respectively disposed at the first edge and the second edge of the array substrate, and the first edge and the second edge are adjacent to each other.

12. A method for manufacturing an array substrate, comprising:
forming a first metal layer on a transparent substrate, in which the first metal layer includes a first metal area disposed at an edge portion of the array substrate, and the first metal area includes at least two first metal sub-areas;

forming an insulating layer on the first metal layer; and forming a second metal layer on the insulating layer, in which the second metal layer includes a second metal area corresponding to and insulated from the first metal area; and at least two capacitors are formed by the at least two first metal sub-areas of the first metal area and the second metal area, wherein the at least two first metal sub-areas are provided in a same layer, and the first metal area and the second metal area are overlapped with each other in a direction perpendicular to a surface of the array substrate so as to form the at least two capacitors;

between the step of forming the insulating layer and the step of forming the second metal layer, further comprising forming a first transparent conductive layer on the insulating layer, which includes:

forming through holes in the insulating layer;

forming a first transparent conductive film on the insulating layer provided with the through holes; and forming common electrodes and a first connecting line through the first transparent conductive film by a patterning process, in which the first connecting line is configured to connect the at least two first metal sub-areas, which are not electrically connected with each other, of the first metal area via the through holes.

13. The manufacturing method according to claim 12, wherein the step of forming the first metal layer on the transparent substrate includes:

forming a first metal film on the transparent substrate; and forming gate electrodes, gate lines, a common electrode line and the first metal area through the first metal film by a patterning process.

14. The manufacturing method according to claim 12, wherein the step of forming the second metal layer on the insulating layer includes:

forming a second metal film on the insulating layer; and forming source electrodes, drain electrodes and the second metal area through the second metal film by a patterning process.

15. The manufacturing method according to claim 12, wherein the step of forming the second metal layer on the insulating layer includes:

forming a second metal film on the insulating layer; and forming source electrodes, drain electrodes, a first connecting line and the second metal area through the second metal film by a patterning process, in which the first connecting line is configured to connect the at least two first metal sub-areas, which are not electrically connected with each other, of the first metal area.

16. The manufacturing method according to claim 12, after the step of forming the second metal layer, further comprising:

forming a passivation layer;

forming through holes in the passivation layer; and forming a second transparent conductive layer on the passivation layer provided with the through holes.

17. The manufacturing method according to claim 16, wherein a second transparent conductive film is formed on the passivation layer provided with the through holes; and pixel electrodes and a second connecting line are formed with the second transparent conductive film by a patterning process, in which the second connecting line is configured to connect the at least two second metal sub-areas, which are not electrically connected with each other, of the second metal area.

18. The manufacturing method according to claim 13, wherein the step of forming the second metal layer on the insulating layer includes:

forming a second metal film on the insulating layer; and forming source electrodes, drain electrodes and the second metal area through the second metal film by a patterning process.

19. The manufacturing method according to claim 13, wherein the step of forming the second metal layer on the insulating layer includes:

forming a second metal film on the insulating layer; and forming source electrodes, drain electrodes, a first connecting line and the second metal area through the second metal film by a patterning process, in which the first connecting line is configured to connect the at least two first metal sub-areas, which are not electrically connected with each other, of the first metal area.

20. An array substrate, comprising a first metal layer, an insulation layer and a second metal layer sequentially provided on a transparent substrate, and a first connecting line provided on the insulation layer, wherein the first metal layer comprises a first metal area disposed at an edge portion of the array substrate, wherein the first metal area includes at least two first metal sub-areas, two of which are disposed at a first edge of the array substrate and a second edge of the array substrate respectively, the first edge and the second edge are adjacent to each other and are located at different sides of the array substrate, and the at least two first metal sub-areas are electrically connected by the first connecting line via through holes in the insulation layer; and the second metal layer comprises a second metal area disposed at the edge portion of the array substrate, corresponding to and insulated from the first metal area, and configured for access of a stabilized voltage that is a fixed voltage, wherein the second metal area includes at least two second metal sub-areas, two of which are respectively disposed at the first edge of the array substrate and the second edge of the array substrate, and are electrically connected with each other directly;

wherein at least two capacitors are formed by the first metal area and the second metal area.

\* \* \* \* \*